United States Patent
Hamburgen et al.

(10) Patent No.: US 10,073,500 B2
(45) Date of Patent: Sep. 11, 2018

(54) VAPOR CHAMBER WITH RING GEOMETRY

(71) Applicant: GOOGLE INC., Mountain View, CA (US)

(72) Inventors: William Riis Hamburgen, Palo Alto, CA (US); Joshua Norman Lilje, San Jose, CA (US); James Cooper, San Francisco, CA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

(21) Appl. No.: 15/284,903

(22) Filed: Oct. 4, 2016

(65) Prior Publication Data

US 2018/0095507 A1 Apr. 5, 2018

(51) Int. Cl.
*G06F 1/20* (2006.01)
*H05K 7/20* (2006.01)

(52) U.S. Cl.
CPC ............ *G06F 1/20* (2013.01); *H05K 7/20336* (2013.01)

(58) Field of Classification Search
CPC .. G06F 1/20; H05K 7/20336; H01M 8/04029; F28D 15/043
USPC ...................... 361/700, 679.47; 257/E23.088
See application file for complete search history.

(56) References Cited

U.S. PATENT DOCUMENTS

| | | | |
|---|---|---|---|
| 6,439,298 B1 * | 8/2002 | Li | F28D 15/0233 165/104.21 |
| 7,180,179 B2 | 2/2007 | Mok et al. | |
| 7,839,630 B2 | 11/2010 | Hwang et al. | |
| 9,258,988 B2 * | 2/2016 | Willenberg | A01M 1/2055 |
| 2005/0280128 A1 * | 12/2005 | Mok | H01L 23/427 257/678 |
| 2006/0164809 A1 * | 7/2006 | Yu | F28D 15/0233 361/704 |
| 2007/0230128 A1 * | 10/2007 | Kim | F28D 15/02 361/699 |

(Continued)

FOREIGN PATENT DOCUMENTS

| | | |
|---|---|---|
| DE | 20 2014 001008 U1 | 8/2014 |
| WO | 2015/119366 A1 | 8/2015 |
| WO | 2015/167419 A1 | 11/2015 |

OTHER PUBLICATIONS

Ju, Y. Sungtaek, et al., "Planar vapor chamber with hybrid evaporator wicks for the thermal management of high-heat-flux and high-power optoelectronic devices", International Journal of Heat and Mass Transfer, vol. 60, 2013, 163-169.

(Continued)

*Primary Examiner* — Mandeep S Buttar
(74) *Attorney, Agent, or Firm* — Brake Hughes Bellermann LLP

(57) ABSTRACT

Techniques of managing heat within an electronic device involve providing a vapor chamber in a ring shape within an electronic device. In some implementations, the vapor chamber forms an outer case wall of an enclosure of the electronic device. In further implementations, the vapor chamber has a fill port attached to the inner edge of the vapor chamber. Advantageously, by using a vapor chamber with a ring geometry in an electronic device according to the improved techniques, a form factor of the electronic device (e.g., a laptop, a tablet, etc.) is not affected by the introduction of the vapor chamber as an outer case wall.

16 Claims, 5 Drawing Sheets

(56) References Cited

U.S. PATENT DOCUMENTS

2009/0244846 A1  10/2009  Tomioka
2012/0170221 A1   7/2012  Mok
2014/0262160 A1   9/2014  Vadakkanmaruveedu et al.

OTHER PUBLICATIONS

International Search Report and Written Opinion received for PCT Patent Application No. PCT/US2017/052507, dated Dec. 12, 2017, 14 pages.

* cited by examiner

300

302 Form a vapor chamber, the vapor chamber having an outer edge and an inner edge, the outer wall surrounding the inner edge, the inner edge surrounding a region of nonzero area external to the vapor chamber, the vapor chamber including, within the outer edge and the inner edge (i) an evaporator surface; (ii) a condensing surface; and (iii) a wick.

304 introduce a liquid into the vapor chamber, the vapor chamber being configured to (i) remove heat from a heat source, (ii) use, by the evaporating surface, the heat to convert the liquid into a gas, (iii) cool, by the condensing surface, the gas back into a liquid as the heat dissipates out of the vapor chamber, and (iv) return, by the wick, the cooled liquid back to the evaporating surface

VAPOR CHAMBER WITH RING GEOMETRY

TECHNICAL FIELD

This description relates to heat transport within electronic devices.

BACKGROUND

Electronic devices such as laptop computers and tablet computers generate a significant amount of heat. Typically, this heat generated by a device is emitted out of the body of the device in the vicinity of a heat-generating mechanism (e.g., a CPU).

SUMMARY

In one general aspect, an electronic device can include a heat source and a vapor chamber configured to remove heat from the heat source, the vapor chamber having an outer edge and an inner edge, the outer wall surrounding the inner edge, the inner edge surrounding a region of nonzero area external to the vapor chamber. The vapor chamber includes, within the outer edge and the inner edge, (i) a liquid, (ii) an evaporator surface configured to use heat removed from the heat source to convert the liquid into a gas, (iii) a condensing surface configured to cool the gas back into a liquid, and (iv) a wick configured to return the cooled liquid back to the evaporating surface.

The details of one or more implementations are set forth in the accompanying drawings and the description below. Other features will be apparent from the description and drawings, and from the claims.

BRIEF DESCRIPTION OF THE DRAWINGS

FIG. 3 is a flow chart that illustrates an example method of implementing the improved techniques shown in FIG. 1 and/or FIG. 2.

DETAILED DESCRIPTION

As mentioned above, conventional techniques of managing heat within an electronic device involve emitting heat out of the body of the electronic device in the vicinity of the heat-generating mechanism. In this way, however, the electronic device will have heat poorly distributed over its body. For example, a laptop generates heat in its base near its CPU, leaving the display cold. It is desirable to distribute heat throughout a device more equitably. A uniformly-heated device may use less power and is more comfortable for the user.

In accordance with the implementations described herein and in contrast with the above-described conventional techniques of managing heat generated within an electronic device, improved techniques involve providing a vapor chamber in a ring shape within an electronic device. In some implementations, the vapor chamber forms an outer case wall of an enclosure of the electronic device. In further implementations, the vapor chamber has a fill port attached to the inner edge of the vapor chamber. Advantageously, by using a vapor chamber with a ring geometry in an electronic device according to the improved techniques, a form factor of the electronic device (e.g., a laptop, a tablet, etc.) is not affected by the introduction of the vapor chamber as an outer case wall.

Figure 1:
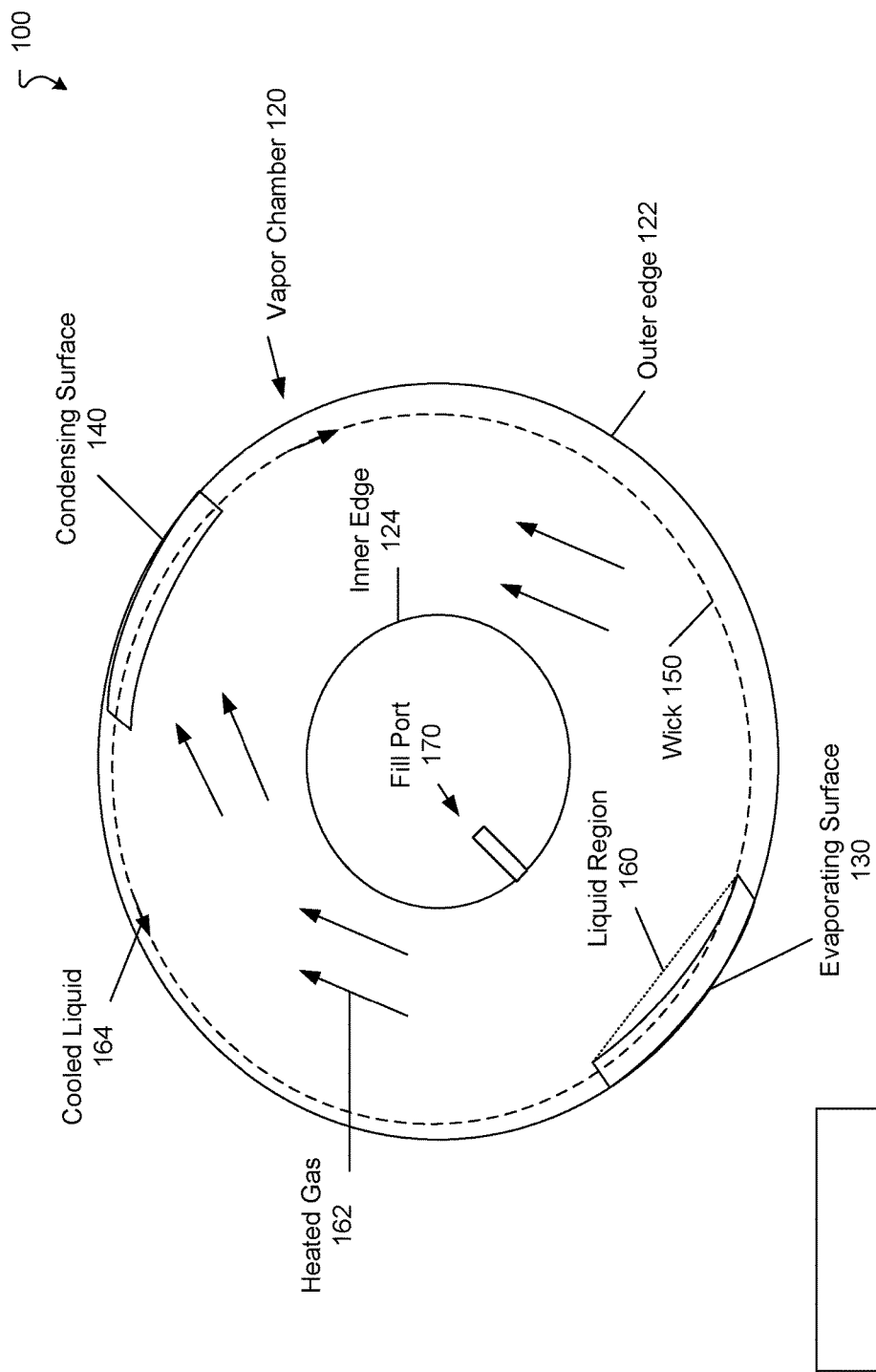
FIG. 1 is a diagram that illustrates a front view of an example electronic device in which improved techniques described herein may be implemented.

FIG. 1 is a diagram that illustrates an example electronic device 100 in which the above-described improved techniques may be implemented. As shown, in FIG. 1, the example electronic device 100 includes a heat source 110 and a vapor chamber 120.

The heat source 110 is configured to generate heat within the electronic device 100. For example, the heat source 110 may be a processor or some form of controlling circuitry when the electronic device 100 is a laptop computer, a smartphone, a tablet computer, or the like. The heat generated by the heat source 110 may cause the electronic device to overheat if not removed from the vicinity of the heat source 110.

The vapor chamber 120 is configured to remove heat from the vicinity of the heat source 110. The vapor chamber includes an evaporating surface 130, a condensing surface 140, a wick 150, a liquid region 160 that may contain a liquid, and a fill port 170. As shown in FIG. 1, the vapor chamber 120 also includes an outer edge 122 and an inner edge 124.

The vapor chamber 120 works by using the heat generated by the heat source 110 to evaporate a liquid in a liquid region 160 into a heated gas 162 at an evaporating surface 130. The vapor chamber 120 may then remove heat from the heated gas 162 at the condensing surface 140 to form the liquid. The liquid may then travel, e.g., by capillary action, along the liquid back to the liquid region 160, where the liquid may again be heated.

The evaporating surface 130 is configured to use heat from the heat source 110 to place liquid in the liquid region 160 into a gas phase in the form of the heated gas 162. In some implementations, the evaporating surface 130 is made from thermally conductive materials to allow heat to pass through from the heat source 110. In some implementations, the liquid region 160 is adjacent to the evaporating surface 130.

The liquid contained in the liquid region 160 may depend on the material from which the vapor chamber 120 is constructed. In one example, when the interior of the chamber includes copper, the liquid may include water. In another example, when the interior of the chamber includes aluminum, the liquid may include ammonia.

The condensing surface 140 is configured to receive heat from heated gas 162 and dissipate the heat out of the vapor chamber 120. The heated gas 162 then condenses back into the liquid and forms on the wick 150. In some implementations, the condensing surface 140 is made from thermally conductive materials to allow heat to pass through to a cooler region. For example, if the vapor chamber 120 forms an outer case wall of an enclosure surrounding the electronic device 100, then the condensing surface 140 may output heat to the environment containing the electronic device 100.

As shown in FIG. 1, the condensing surface 140 is placed opposite the evaporating surface 130 within the vapor chamber 120. However, it should be appreciated that the evaporating surface 130 and the condensing surface 140 may be placed anywhere within the vapor chamber 120.

The wick 150 is configured to deliver the liquid formed by the condensation of the heated gas 162 at the condensing surface 140 to the evaporating surface 130. The delivery of the liquid may be achieved through capillary action along the wick 150. In some implementations, the wick 150 may be constructed from sintered copper. As shown in FIG. 1, the wick 150 is located along the outer edge 122. However, in some implementations, the wick 150 may be located along the inner edge 124. In still other implementations, the wick 150 may be located along both the outer edge 122 and the inner edge 124.

The fill port 170 is configured to introduce and/or remove the liquid into the vapor chamber 120. As shown in FIG. 1, the fill port 170 is attached the inner surface 124 of the vapor chamber 120. An advantage of attaching the fill port 170 to the inner surface 124 is that the vapor chamber 120 can form an outer case wall of an enclosure surrounding the electronic device 100 such that the fill port 170 would not stick out of the outer case wall.

In some implementations, each of the outer edge 122 and inner edge 124 forms a close curve. In one example, each of the outer edge 122 and inner edge 124 forms a circle. In other examples, each of the outer edge 122 and inner edge 124 has a polygonal shape such as a rectangle.

In some implementations, when the fill port 170 is attached to the inner edge as shown in FIG. 1, liquid may be introduced into the vapor chamber 120 via the fill port 170 by bending the vapor chamber 120 to expose the fill port 170. In this case, the outer case wall formed by the vapor chamber 120 may be flexible to enable such bending.

Figure 2:
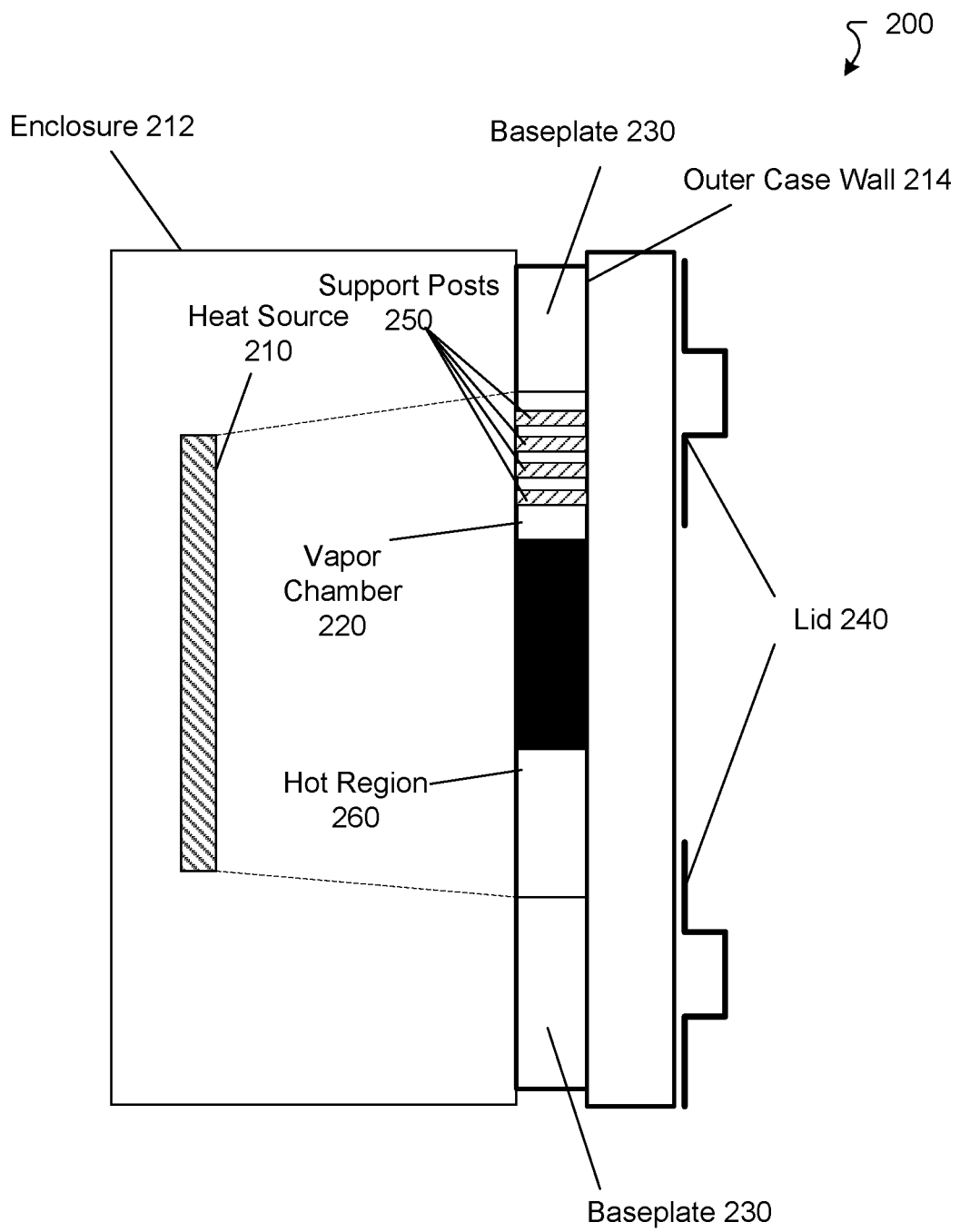
FIG. 2 is a diagram that illustrates a side view of another example electronic device in which the improved techniques described herein may be implemented.

FIG. 2 is a diagram that illustrates a side view of an electronic device 200. The electronic device 200 includes a heat source 210 similar to the heat source 110 and an enclosure 212 that surrounds the heat source 210. The enclosure includes an outer case wall 214.

The outer case wall 214 is configured to provide an outlet for heat produced by the heat source 210. The outer case wall 214 is formed from a vapor chamber 220 in that the vapor chamber 220 is attached to an interior of the outer case wall 214. The dark region at the center of the interior of the outer case wall 214 is the center of the vapor chamber 220. The outer case wall 214 includes a baseplate 230 and a lid 240.

The baseplate 230 may be made from a heavy material such as a ceramic to provide a strong enclosure for the electronic device 200. Further, in some implementations, the baseplate 230 may be machined down to any desirable thickness. Such machining may provide a cosmetic outer case surface.

The vapor chamber 220 may be formed from clad materials. In some implementations, the exterior of the vapor chamber 220 and the interior of the vapor chamber 220 are fashioned from different clad materials. In such implementations, the clad materials from which the exterior of the vapor chamber 220 is fashioned may be etched back to facilitate laser sealing of the vapor chamber 220.

The vapor chamber 220 further includes support posts 250. The supports posts 250 are configured to provide structural support to accommodate a pressure difference across the vapor chamber 220. The supports posts 250 may be formed from the same materials (e.g., clad materials) used to fashion the interior of the vapor chamber 220.

In some implementations and as shown in FIG. 2, there are no supports posts 250 between the heat source 210 and the baseplate 230. Along these lines, the heat source 210 may generate a hot region 260 on the vapor chamber 220. The hot region 260 is the region of the vapor chamber 220 being directly heated by the heat source 210. In this case, the support posts 250 are not placed in the vapor chamber 220 within the hot region 260.

The lid 240 is configured to enable a user to carry the electronic device 200 and/or remove the outer case wall from the electronic device 200.

FIG. 3 is a flow chart that illustrates an example method 300 of implementing the improved techniques shown in FIG. 1 and/or FIG. 2.

At 302, a vapor chamber is formed. The vapor chamber has an outer edge and an inner edge, the outer wall surrounding the inner edge, the inner edge surrounding a region of nonzero area external to the vapor chamber. The vapor chamber includes, within the outer edge and the inner edge, (i) an evaporator surface, (ii) a condensing surface, and (iii) a wick.

At 304, a liquid is introduced into the vapor chamber. The vapor chamber is configured to (i) remove heat from a heat source, (ii) use, at the evaporating surface, the heat to convert the liquid into a gas, (iii) cool, at the condensing surface, the gas back into a liquid as the heat dissipates out of the vapor chamber, and (iv) return, by the wick, the cooled liquid back to the evaporating surface.

Figure 4:
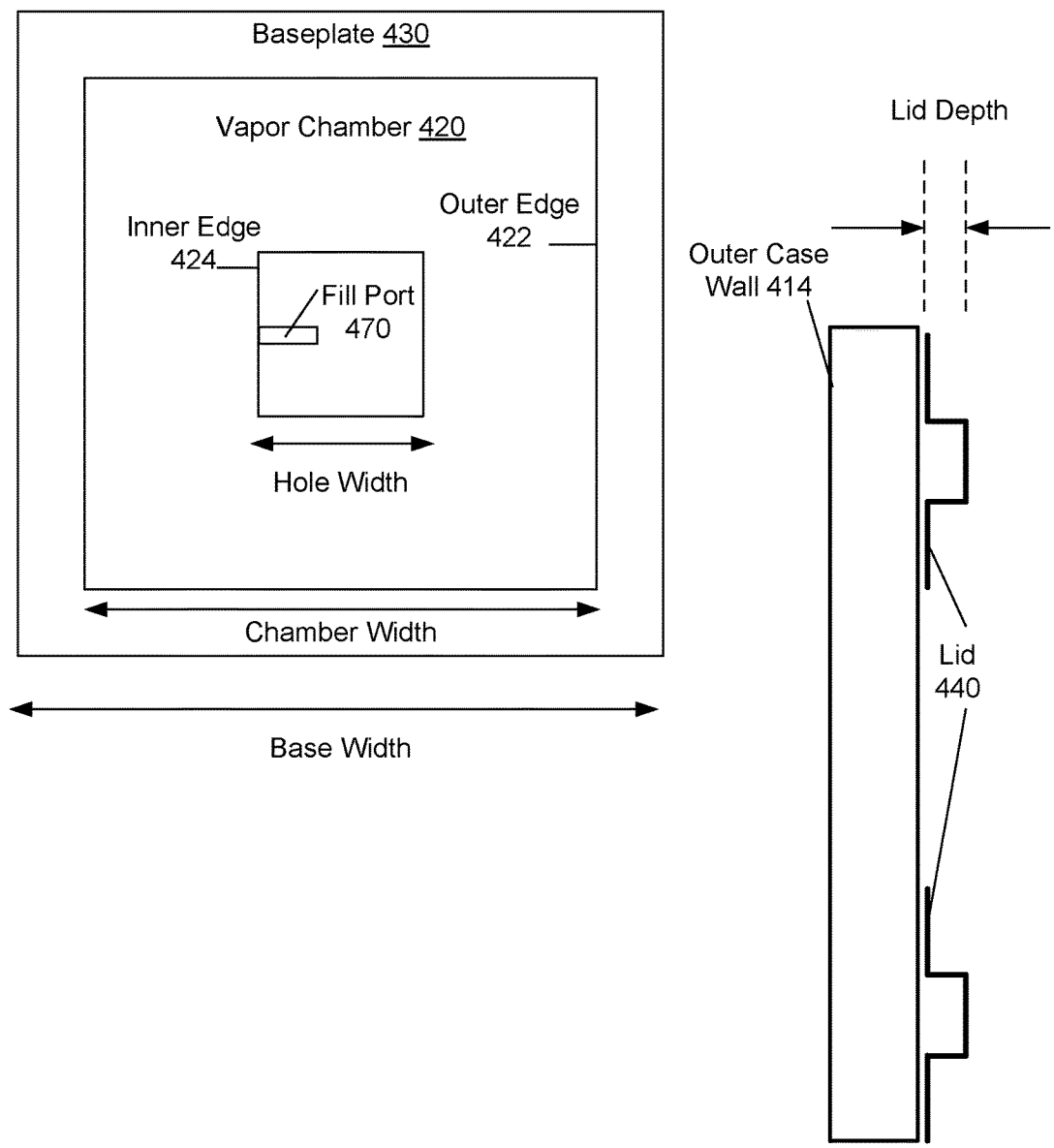
FIG. 4 is a diagram that illustrates front and side views of another example electronic device in which the improved techniques described herein may be implemented.

FIG. 4 is a diagram that illustrates front and side views of another example electronic device 400. The electronic device 400 includes an outer case wall 414 similar to the outer case wall 214 and is formed from a ring-shaped vapor chamber 420, which in turn is formed from a baseplate 430.

The ring-shaped vapor chamber, unlike the vapor chamber 120 shown in FIG. 1, is shaped like a rectangular annulus, i.e., each of the outer edge 422 and inner edge 424 are rectangles. The vapor chamber 420 includes a fill port 470 attached to the inner edge 424 such that the fill port 470 opens in the interior of a region defined by the inner edge 424, or hole.

The baseplate 430, vapor chamber 420, and the hole each have respective widths. Example widths of the baseplate 430, vapor chamber 420, and hole may be about, respectively, 200 mm, 140 mm, and 70 mm. The width of the baseplate 430 may be constrained by considerations of a form factor of the electronic device 200, e.g., the width of the baseplate 430 may be smaller when the electronic device 200 is a smartphone or larger when the electronic device 200 is a tablet computer or laptop computer. Further, the width of the hole relative to the width of the vapor chamber 420 may be constrained by the fill port 470.

Moreover, an example thickness of the baseplate 430 may be in the range of about 2 mm-20 mm. The baseplate 430 may be fashioned on the large end of the thickness range so that it may be further machined at a later time. Further, the lid 440 may have a thickness of about 1 mm.

As shown in FIG. 4, the lid 440 also has a lid depth defined by a protrusion of the lid away from the baseplate 430. For example, the lid depth may be in the range of about 3 mm to about 4 mm. The size of the lid depth places a constraint on the length of the fill port 470 in that it is desirable for the fill port 470 to have a length much smaller than the size of the lid depth.

Figure 5:
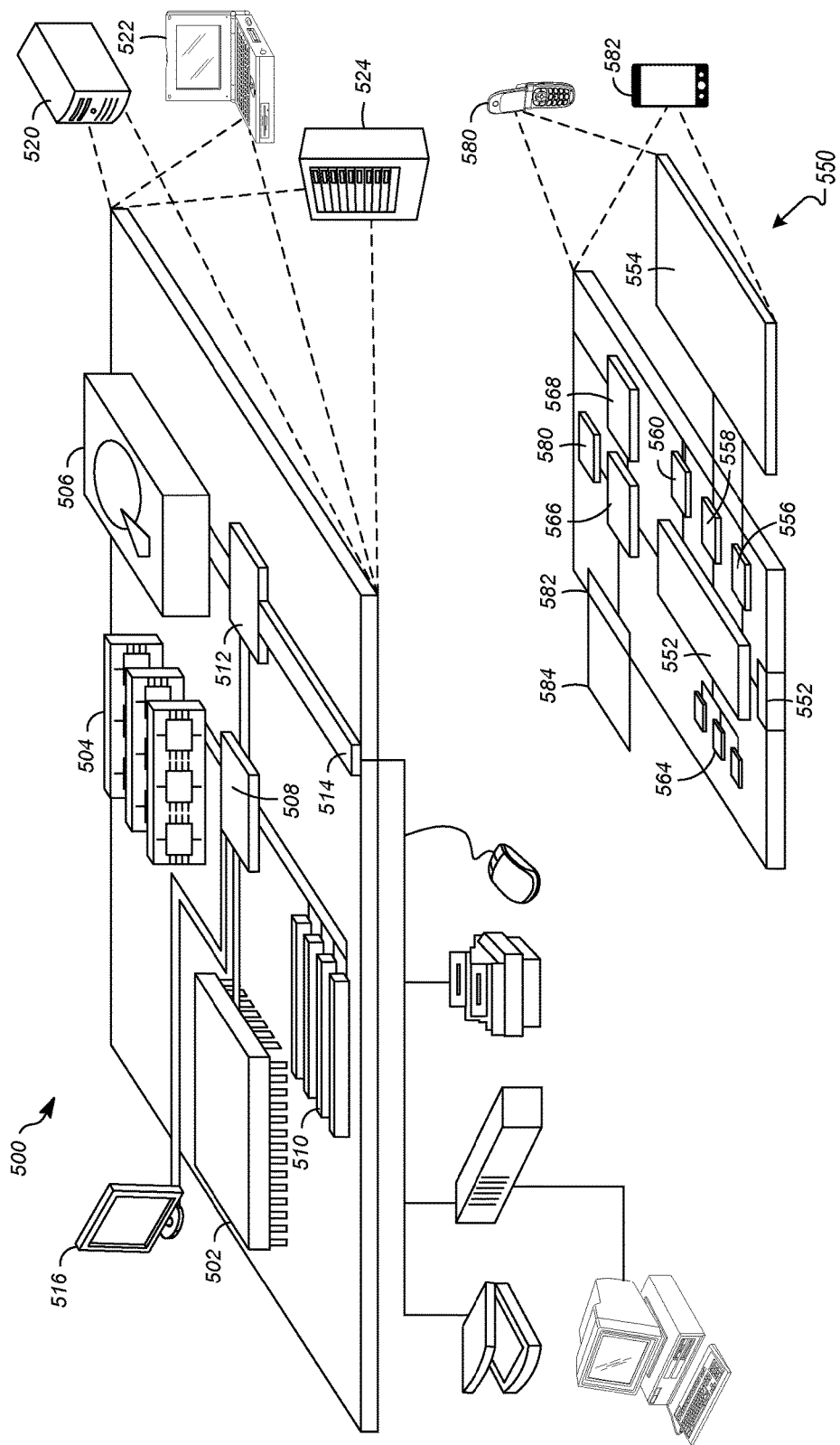
FIG. 5 illustrates an example of a computer device and a mobile computer device that can be used with circuits described here.

FIG. 5 illustrates an example of a generic computer device 500 and a generic mobile computer device 550, which may be used with the techniques described here.

As shown in FIG. 5, computing device 500 is intended to represent various forms of digital computers, such as laptops, desktops, workstations, personal digital assistants, servers, blade servers, mainframes, and other appropriate computers. Computing device 550 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device 500 includes a processor 502, memory 504, a storage device 506, a high-speed interface 508 connecting to memory 504 and high-speed expansion ports 510, and a low speed interface 512 connecting to low speed bus 514 and storage device 506. Each of the components 502, 504, 506, 508, 510, and 512, are interconnected using various busses, and may be mounted on a common motherboard or in other manners as appropriate. The processor 502 can process instructions for execution within the computing device 500, including instructions stored in the memory 504 or on the storage device 506 to display graphical information for a GUI on an external input/output device, such as display 516 coupled to high speed interface 508. In other implementations, multiple processors and/or multiple buses may be used, as appropriate, along with multiple memories and types of memory. Also, multiple computing devices 500 may be connected, with each device providing portions of the necessary operations (e.g., as a server bank, a group of blade servers, or a multi-processor system).

The memory 504 stores information within the computing device 500. In one implementation, the memory 504 is a volatile memory unit or units. In another implementation, the memory 504 is a non-volatile memory unit or units. The memory 504 may also be another form of computer-readable medium, such as a magnetic or optical disk.

The storage device 506 is capable of providing mass storage for the computing device 500. In one implementation, the storage device 506 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 504, the storage device 506, or memory on processor 502.

The high speed controller 508 manages bandwidth-intensive operations for the computing device 500, while the low speed controller 512 manages lower bandwidth-intensive operations. Such allocation of functions is exemplary only. In one implementation, the high-speed controller 508 is coupled to memory 504, display 516 (e.g., through a graphics processor or accelerator), and to high-speed expansion ports 510, which may accept various expansion cards (not shown). In the implementation, low-speed controller 512 is coupled to storage device 506 and low-speed expansion port 514. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 500 may be implemented in a number of different forms, as shown in the figure. For example, it may be implemented as a standard server 520, or multiple times in a group of such servers. It may also be implemented as part of a rack server system 524. In addition, it may be implemented in a personal computer such as a laptop computer 522. Alternatively, components from computing device 500 may be combined with other components in a mobile device (not shown), such as device 550. Each of such devices may contain one or more of computing device 500, 550, and an entire system may be made up of multiple computing devices 500, 550 communicating with each other.

Computing device 550 includes a processor 552, memory 564, an input/output device such as a display 554, a communication interface 566, and a transceiver 568, among other components. The device 550 may also be provided with a storage device, such as a microdrive or other device, to provide additional storage. Each of the components 550, 552, 564, 554, 566, and 568, are interconnected using various buses, and several of the components may be mounted on a common motherboard or in other manners as appropriate.

The processor 552 can execute instructions within the computing device 550, including instructions stored in the memory 564. The processor may be implemented as a chipset of chips that include separate and multiple analog and digital processors. The processor may provide, for example, for coordination of the other components of the device 550, such as control of user interfaces, applications run by device 550, and wireless communication by device 550.

Processor 552 may communicate with a user through control interface 558 and display interface 556 coupled to a display 554. The display 554 may be, for example, a TFT LCD (Thin-Film-Transistor Liquid Crystal Display) or an OLED (Organic Light Emitting Diode) display, or other appropriate display technology. The display interface 556 may comprise appropriate circuitry for driving the display 554 to present graphical and other information to a user. The control interface 558 may receive commands from a user and convert them for submission to the processor 552. In addition, an external interface 562 may be provided in communication with processor 552, so as to enable near area communication of device 550 with other devices. External interface 562 may provide, for example, for wired communication in some implementations, or for wireless communication in other implementations, and multiple interfaces may also be used.

The memory 564 stores information within the computing device 550. The memory 564 can be implemented as one or more of a computer-readable medium or media, a volatile memory unit or units, or a non-volatile memory unit or units. Expansion memory 574 may also be provided and connected to device 550 through expansion interface 572, which may include, for example, a SIMM (Single In Line Memory Module) card interface. Such expansion memory 574 may provide extra storage space for device 550, or may also store applications or other information for device 550. Specifically, expansion memory 574 may include instructions to carry out or supplement the processes described above, and may include secure information also. Thus, for example, expansion memory 574 may be provided as a security module for device 550, and may be programmed with instructions that permit secure use of device 550. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 564, expansion memory 574, or memory on processor 552, that may be received, for example, over transceiver 568 or external interface 562.

Device 550 may communicate wirelessly through communication interface 566, which may include digital signal processing circuitry where necessary. Communication interface 566 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 568. In addition, short-range communication may occur, such as using a Bluetooth, WiFi, or other such transceiver (not shown). In addition, GPS (Global Positioning System) receiver module 570 may provide additional navigation- and location-related wireless data to device 550, which may be used as appropriate by applications running on device 550.

Device 550 may also communicate audibly using audio codec 560, which may receive spoken information from a user and convert it to usable digital information. Audio codec 560 may likewise generate audible sound for a user, such as through a speaker, e.g., in a handset of device 550. Such sound may include sound from voice telephone calls, may include recorded sound (e.g., voice messages, music files, etc.) and may also include sound generated by applications operating on device 550.

The computing device 550 may be implemented in a number of different forms, as shown in the figure. For example, it may be implemented as a cellular telephone 580. It may also be implemented as part of a smart phone 582, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

A number of embodiments have been described. Nevertheless, it will be understood that various modifications may be made without departing from the spirit and scope of the specification.

It will also be understood that when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

What is claimed is:

1. An electronic device, comprising:
   a heat source; and
   a vapor chamber configured to remove heat from the heat source, the vapor chamber having an outer edge and an inner edge, the outer edge surrounding the inner edge, the inner edge surrounding a region of nonzero area external to the vapor chamber, the vapor chamber including, within the outer edge and the inner edge:
   an evaporator surface at which heat is removed from the heat source to convert a liquid into a gas;
   a condensing surface at which the gas is cooled back into a liquid; and
   a wick configured to return the cooled liquid back to the evaporating surface; and
   a fill port configured to introduce and/or remove the liquid into the vapor chamber, wherein the fill port is attached to the inner edge of the vapor chamber.

2. The electronic device as in claim 1, further comprising an enclosure surrounding the vapor chamber, wherein the vapor chamber includes at least a portion of an outer case wall of the enclosure.

3. The electronic device as in claim 2, wherein the outer case wall includes a baseplate outside of the vapor chamber.

4. The electronic device as in claim 1, wherein the outer edge and the inner edge each have a circular shape.

5. The electronic device as in claim 1, wherein the outer edge and the inner edge each have a polygonal shape.

6. The electronic device as in claim 1, further comprising support posts within the vapor chamber, the support posts extending between facing surfaces of supporting the vapor chamber.

7. The electronic device as in claim 6, wherein the heat source occupies an area that, when projected onto the vapor chamber, forms a hot region of the vapor chamber, and
   wherein the supports posts are located outside of the hot region of the vapor chamber.

8. The electronic device as in claim 1, wherein a wall of the vapor chamber has an exterior surface and an interior surface, the interior surface including a first clad material and the exterior surface including a second clad material different from the first clad material.

9. The electronic device as in claim 8, wherein the second clad material is laser sealed.

10. The electronic device as in claim 1, wherein each of the outer edge and the inner edge form closed loops.

11. The electronic device as in claim 1, wherein the wick is located along the outer edge of the vapor chamber in an interior of the vapor chamber, and wherein the liquid into which the gas is cooled at the condensing surface is transported by the wick by capillary action along the wick.

12. An apparatus, comprising:
    a vapor chamber configured to remove heat, the vapor chamber having an outer edge and an inner edge, the outer edge surrounding the inner edge, the inner edge surrounding a region of nonzero area external to the vapor chamber, the vapor chamber including, within the outer edge and the inner edge:
    an evaporator surface at which heat is removed to convert a liquid into a gas;
    a condensing surface at which the gas is cooled back into a liquid; and
    a wick configured to return the cooled liquid back to the evaporating surface; and
    a fill port configured to introduce and/or remove the liquid into the vapor chamber, wherein the fill port is attached to the inner edge of the vapor chamber.

13. The apparatus as in claim 12, wherein the apparatus further includes: a baseplate thermally coupled to the vapor chamber; and an enclosure surrounding the vapor chamber and a source of the heat.

14. The apparatus as in claim 12, wherein the vapor chamber further includes: an interior surface and an exterior surface, the interior surface including a first clad material, the exterior surface including a second clad material.

15. The apparatus as in claim 14, wherein the second clad material is laser sealed.

16. The apparatus as in claim 12, wherein the vapor chamber is configured to bend to expose the fill port.

* * * * *